United States Patent [19]
Kappler

[11] Patent Number: 5,529,081
[45] Date of Patent: Jun. 25, 1996

[54] APPARATUS FOR THE TREATMENT OF BOARD-LIKE ARTICLES

[75] Inventor: Heinz Kappler, Dornstetten-Asch, Germany

[73] Assignee: Gebr. Schmid GmbH & Co., Freudenstadt, Germany

[21] Appl. No.: 902,319

[22] Filed: Jun. 22, 1992

[30] Foreign Application Priority Data

Jun. 26, 1991 [DE] Germany .............. 41 21 079.4

[51] Int. Cl.$^6$ .................................................. B08B 3/02
[52] U.S. Cl. .................. 134/64. R; 134/122 R; 134/199; 134/131
[58] Field of Search .................. 134/73, 69 R, 134/122 R, 64 P, 122 P, 199, 131; 178/629, 721, 620, 624, 836.2, 836.1, 836.3; 15/77, 102; 156/345, 637.1; 198/626.1, 817, 620, 785, 481.1; 118/404, 500

[56] References Cited

U.S. PATENT DOCUMENTS

| | | | |
|---|---|---|---|
| 3,071,144 | 1/1963 | Hilliker | 134/49 X |
| 3,082,774 | 3/1963 | Benton et al. | 15/102 |
| 3,310,295 | 3/1967 | Haak | 134/122 |
| 3,398,871 | 8/1968 | Ungerer . | |
| 3,460,668 | 8/1969 | Gerrans | 198/271 X |
| 3,585,696 | 6/1971 | Aronoff | 68/5 D |
| 3,591,450 | 7/1971 | Murphy et al. | 134/122 R |
| 3,620,139 | 11/1971 | Kulwicki | 198/620 X |
| 3,636,662 | 1/1972 | Maca | 15/77 |
| 3,643,278 | 2/1972 | Harris | 15/77 |
| 3,815,482 | 6/1974 | Nelson | 198/620 |
| 3,897,230 | 7/1975 | Taylor | 134/64 R |
| 4,144,960 | 3/1979 | Scourtes . | |
| 4,185,648 | 1/1980 | Germain | 134/122 R |
| 4,241,910 | 12/1980 | Matsuo | 15/77 X |
| 4,475,259 | 10/1984 | Ishii et al. | 134/64 R X |
| 4,561,819 | 12/1985 | Wiernicki | 198/624 |
| 4,593,810 | 6/1986 | Cook | 198/721 X |
| 4,724,856 | 2/1988 | Pender | 134/122 R X |
| 4,754,867 | 7/1988 | De Anda | 198/836.3 |
| 4,776,939 | 10/1988 | Blasing et al. . | |
| 4,823,940 | 8/1989 | Crester | 198/817 |
| 4,840,268 | 6/1989 | Zemek | 198/817 |
| 4,922,938 | 5/1990 | Siegmund et al. | 134/131 |
| 4,938,257 | 7/1990 | Morris | 134/64 R |
| 5,007,445 | 4/1991 | Pender | 134/122 R |
| 5,024,745 | 6/1991 | Rischke et al. . | |
| 5,154,772 | 10/1992 | Kallfass . | |

FOREIGN PATENT DOCUMENTS

| | | | |
|---|---|---|---|
| 2655030 | 5/1991 | France | 198/624 |
| 28251510 | 11/1978 | Germany . | |
| 243682 | 12/1985 | Germany . | |
| 3805596 | 2/1988 | Germany . | |
| 3826953 | 8/1988 | Germany . | |
| 8911572 | 9/1989 | Germany . | |
| 63-154504 | 6/1988 | Japan | 198/624 |
| 2154973 | 9/1985 | United Kingdom . | |

OTHER PUBLICATIONS

Japanese Patent Abstract No. 2-225,215, *Patent Abstracts of Japan*, vol. 14, No. 536, Nov. 27, 1990.
Japanese Patent Abstract No. 63-66010, *Patent Abstracts of Japan*, vol. 12, No. 289, Aug. 8, 1988.

*Primary Examiner*—Frankie L. Stinson
*Attorney, Agent, or Firm*—Barry R. Lipsitz

[57] ABSTRACT

In an apparatus for the treatment of board-shaped articles, particularly printed circuit boards, with a liquid treatment medium, particularly a cleaning, etching, metallizing or rinsing liquid, along a substantially horizontal conveying path defined by a conveying means, for improving the handling of thin circuit boards it is proposed that the conveying means on either side of the conveying path and both above and below the conveying plane comprises elements guiding the longitudinal edges of the boards.

41 Claims, 5 Drawing Sheets

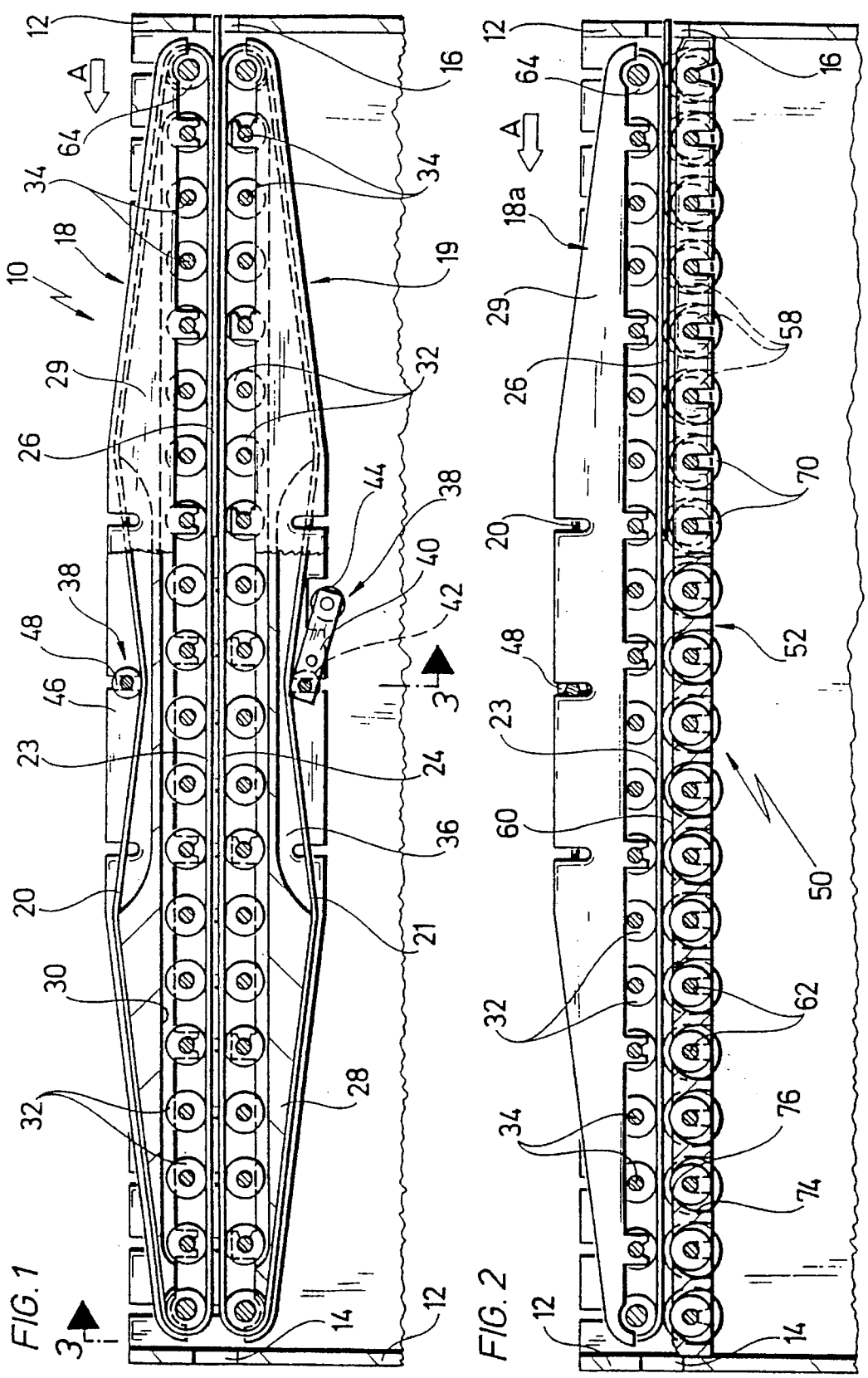

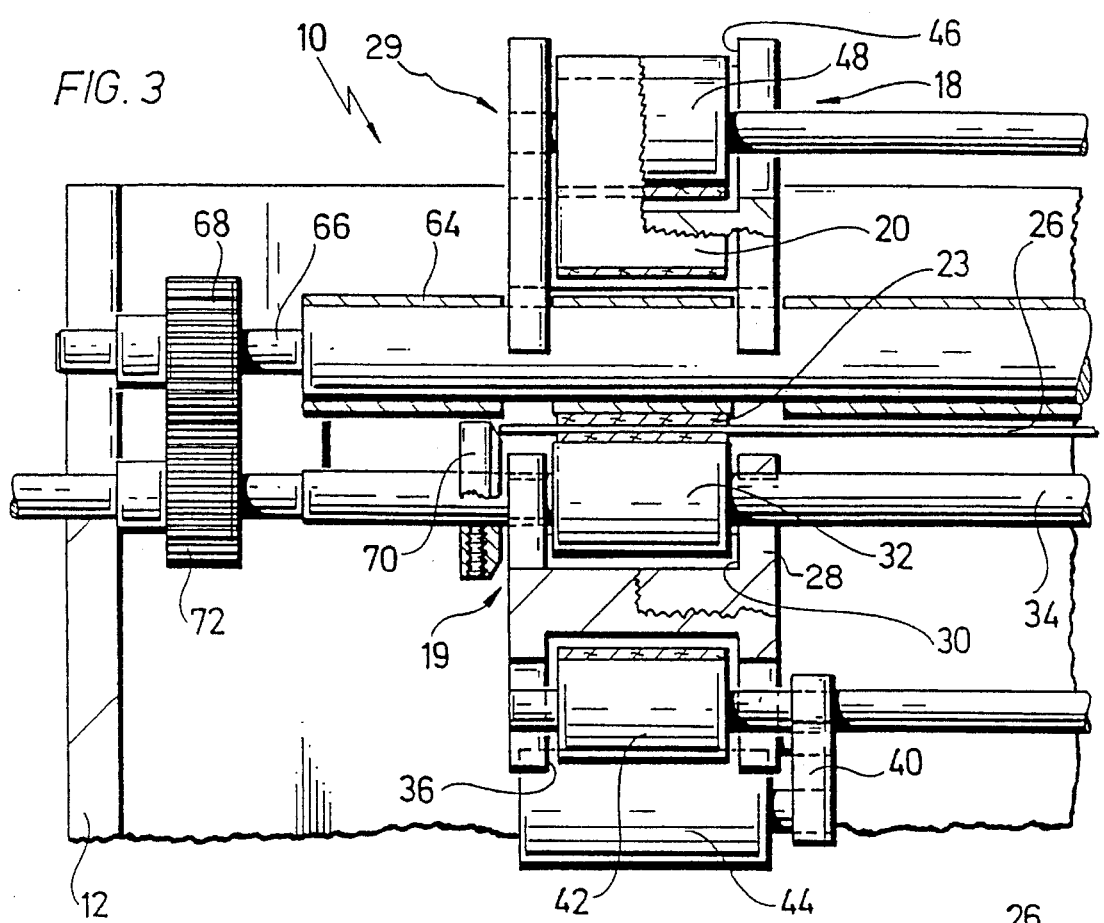
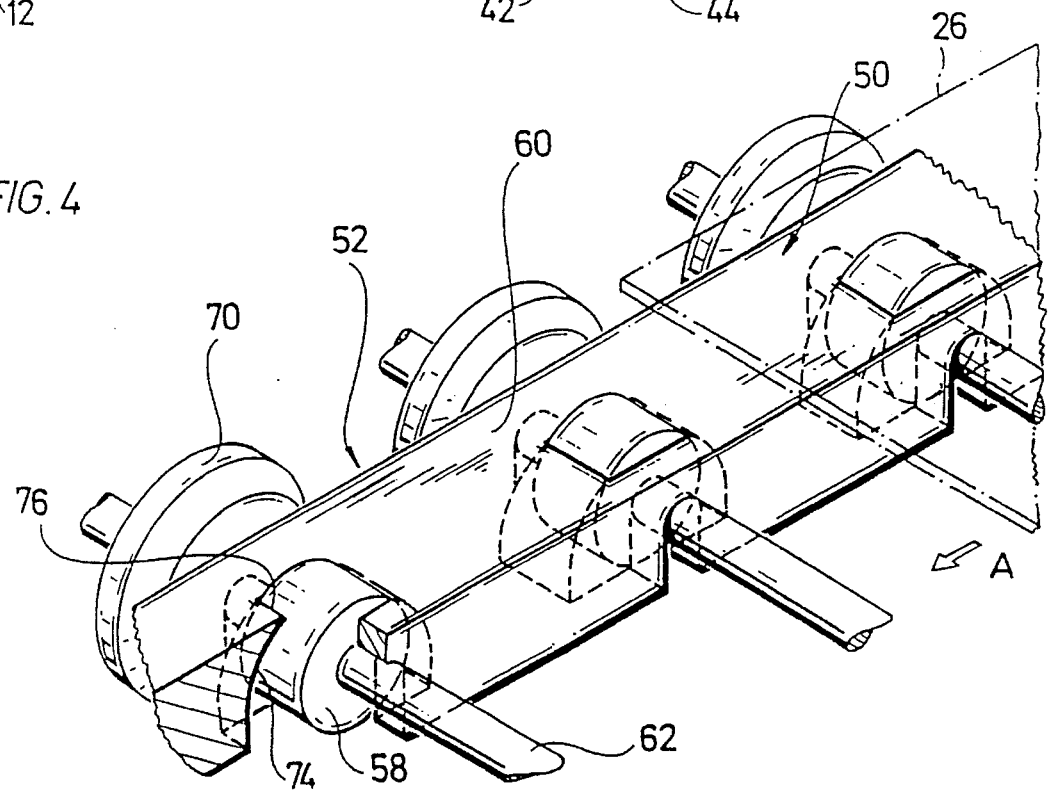

APPARATUS FOR THE TREATMENT OF BOARD-LIKE ARTICLES

BACKGROUND OF THE INVENTION

The invention relates to an apparatus for the treatment of board-like articles, particularly printed circuit boards, with a liquid treatment medium, particularly a cleaning, etching, metallizing or rinsing liquid, along a substantially horizontal conveying path, which is defined by a conveying Apparatuses of this type are already known in the form of etching apparatuses and the like for printed circuit boards. The conveying means is generally formed by a rolling table, which defines the conveying plane and over which the boards are movable in the conveying direction.

In the manufacture of so-called multilayer printed circuit boards the individual layers thereof are individually subjected to the different cleaning, etching, metallizing or rinsing processes and are only joined in the finally developed form to give the multilayer board.

So as to ensure that the overall board thickness does not become excessive in the case of a large number of individual layers in a multilayer board, the layer thicknesses of said board have been constantly decreased with increasing integration density. The boards do have self supporting resilient stiffness or rigidity but rot adequate for conventional conveying, so that the leading edge of the board is not always precisely located in the conveying plane defined by the rolling table and instead bergs and diverges therefrom. This leads to problems in the conveying of the boards, because upwardly and downwardly bent boards strike against and are held back on parts of the conveying means.

OBJECTS OF THE INVENTION

An object of the of the invention is to propose an apparatus for the treatment of board-like articles, which in particular enables a reliable handling of such thin printed circuit boards along their conveying path.

SUMMARY OF THE INVENTION

According to the invention the conveying means has on either side of the conveying path and below and above the conveying plane elements guiding the longitudinal edges of the boards.

It has surprisingly been found that there is no need for supporting the flexible printed circuit boards or the individual layers of a multilayer board in the central region, if the longitudinal edges of the boards and the marginal areas parallel thereto are guided by guide elements above and below the conveying plane.

This guidance is sufficient to prevent the leading edge, particularly the corner regions thereof, from bending and hindering or even preventing the further conveying of the printed circuit board.

It is also possible to additionally place between the guide elements on either side of the conveying path a support for the printed circuit boards in the form of a rolling table.

As the treatment media are generally applied to the printed circuit board by spraying, splashing, etc. and as it is important to obtain a uniform treatment of the entire board surface which is of interest, it must be ensured that the rolls of the rolling table do not cover excessive areas of the board surface to be treated.

The risk of a non-uniform treatment of the circuit boards on the bottom thereof is in particular prevented if the rolls of the rolling table, which are arranged in rows and transversely with respect to the conveying path, are laterally displaced with respect to the rolls of the preceding row in the conveying direction. Therefore the time interval during which a surface increment of the board is covered by the rolls of the rolling table is relatively short, so that the brief covering action is not noticeable with respect to the treatment result on the board bottom.

The guide elements of the conveying means can be constructed in such a way that they embrace and cover the edge of the boards, because frequently there is no need to treat the latter in the marginal area.

The guide elements can comprise elongated guide tables positioned below the conveying plane and on either side of the conveying path, which at regular intervals along the conveying path have recesses open to the side thereof facing the conveying plane. In said recesses are arranged in rotary manner rolls, so that they are only held with their circumferential surface projecting slightly over the guide table plane.

The guide tables ensure that the leading edge is held in the vicinity of the front corners of the circuit board with only slight tolerances in the conveying plane, whilst the rolls located in the recesses of the table prevent the circuit board from rubbing over the guide table plane.

Simultaneously the rolls can be driven, which brings about the conveying of the printed circuit boards in the conveying direction.

Another advantageous manner of guiding the circuit board edges involves the use of guide elements, which comprise continuously revolving, optionally drivable belts, which with their upper or lower sides or strands cover and embrace the marginal areas of the boards running parallel to the longitudinal edges. The belts can be constructed in such a way that they are permeable or impermeable to the treatment medium.

In the case of a permeability for the treatment medium, the effect of the covering of the marginal areas along the longitudinal edges of the boards is reduced and a specific treatment of the board surface also takes place in the area where they are engaged by the belts.

When using medium-impermeable belts no treatment of the edges of the circuit boards is obtained. If this is particularly desired by rolling the belts on the board it can be ensured that the connection between the belt and the board becomes so narrow that a certain sticking action occurs, which also prevents a liquid exchange taking place in the area between the belt and the board.

Preferably, in such cases, a construction is chosen in which the guide elements with the continuously revolving belts are positioned both above and below the conveying plane. However, it is adequate if only the belts above or below the conveying plane are drivable.

As a result of the covering action of the belts and the prevention of access of treatment liquid, the belts are generally given a width such that they merely cover and engage the marginal areas of the boards which are not to be treated.

In order to ensure a uniform conveying of the boards through the apparatus, the individual endless belt is dimensioned in such a way that it extends with its side or strand facing the conveying plane substantially over the entire conveying path within the apparatus. This prevents any transfer between one belt conveying system and the next within the apparatus.

When using the belts as guide elements it is important that they remain in the intended lateral position of the conveying path and do not migrate towards the centre of the conveying plane.

It has surprisingly been found that it is adequate for a precise guidance of the endless belts, if they are only laterally guided on their side remote from the conveying plane. The guidance of the remote side is advantageously supplemented by a tensioning device, which can e.g. be in the form of a spring-loaded idling roll.

The guide elements with the endless belts can be easily combined with the guide elements in the form of guide tables, the latter being positioned below the conveying plane and the endless belts as guide elements are positioned above the conveying plane.

If the marginal area is also to undergo a clearly defined treatment comparable with that of the centre of the board, then preferably in the guide tables on the side thereof facing the conveying plane there are offsets extending over the entire width and which, considered in the conveying direction are positioned following the recesses receiving the rolls. The offsets in the guide tables ensure that a treatment medium comes into contact with the marginal area of the board surface, which also ensures that this board area is treated.

Preferably these offsets have a sawtooth shape and an initially step-like resetting with respect to the conveying plane is substantially directly linked with the preceding recess in the conveying direction and a gently rising surface following onto the step returns towards the conveying plane.

For avoiding dead water zones, it has proved advantageous to bring about a marked rounding of the edge regions of the offsets.

This special construction of the offsets in the guide tables ensures that even if the leading edge of the printed circuit boards should diverge somewhat out of the conveying plane in the vicinity of the offset, during the conveying process the edge is gradually automatically returned to the conveying plane, before the next roll arranged in a recess of the guide table comes into contact with the leading edge of the board.

The distances between successive offsets are preferably kept as small as possible, so that every effort is made to avoid contact of the circuit boards moving in the conveying direction with the guide table surface. This reduces to a minimum undesired decelerating effects of the circuit boards during the conveying operation. As the areas of the guide tables closest to the conveying plane are limited to those portions of the conveying path in which the rolls located in the recesses ensure a raising of the boards at least in the edge and guide table area, this simultaneously leads to minimum fault susceptibility for the conveying system. A tilting of the circuit boards in the conveying means due to different travel speeds on either side of the conveying path is therefore virtually impossible.

Although between two following recesses of the guide tables provided with rolls it is possible to have several offsets, preferably there is only a single offset between two recesses. This not only simplifies the construction of the guide tables, but also allows relatively gentle gradients of the surfaces of the sawtooth-like offsets returning towards the conveying plane. However, the surface of the marginal area of the board opposite to the offset is free over a relatively long distance and therefore accessible to treatment with the treatment medium. The guide tables as guide elements can be used both above and below the conveying plane, the treatment of the marginal areas of the boards being possible on both the top and bottom.

The spacings of the recesses of the guide tables can be made the same above and below the conveying plane. The rolls located in the recesses are arranged in facing manner with respect to the conveying plane.

However, preferably the spacing of the recesses of the guide tables with respect to those located above the conveying plane are made larger than those located below said plane, because the treatment of the printed circuit boards on the top surface thereof is always more critical than on the bottom surface, e.g. due to a damming back of the treatment liquid, so that there are undesirably different treatment times for individual areas of the boards.

Preferably the spacing of the recesses in the case of the guide elements above the conveying plane is roughly twice as large as that in the tables located below the conveying plane. The offsets with the gently rising surfaces with the guide tables positioned above the conveying plane cover roughly twice the area compared with those below the conveying plane. This leads to a more uniform drainage on the top, which avoids the aforementioned top surface treatment problems.

It is also advantageous if the recesses of the guide tables above the conveying plane and the rolls held therein are substantially aligned with the recesses in the guide tables positioned below the same, so that the rolls in the recesses have substantially parallel rotation axes or spindles located in a common vertical plane facing with respect to the conveying plane. Preferably the rolls located in the recesses of the lower guide tables are simultaneously used for conveying the circuit boards and are at least partly driven.

The openings in the side of the guide tables facing the conveying plane and belonging to the recesses are dimensioned in such a way that when the rolls are inserted only relatively small gaps remain between the rolls and the guide tables. This construction will also reliably prevent in the case of very thin circuit boards, that the leading edges and corners of said boards become trapped on the guide tables in the vicinity of the recesses.

Preferably the width of the rolls or their circumferential surface is made smaller than the width of the guide tables, the openings associated with the recesses then being advantageously surrounded by the surface of the guide tables adjacent to the conveying plane. Rolls already inserted in the recesses and openings consequently receive the necessary lateral guidance. In addition, the width of the guidance elements becomes less critical, because the circuit board is slightly raised from the guide tables in the vicinity of the rolls, so that at this point an access of the treatment liquid is possible.

Thus, on omitting the rolling tables in the area between the lateral guide elements, the guide tables can be made somewhat wider, at least below the conveying plane, so that with comparatively thin boards there is an adequate board support and therefore sagging of the boards is counteracted, without casting doubts on the treatment result.

The shielding effect by the resting of the boards on the roll circumference can be reduced in that the circumferential surface of the rolls located in the recesses of the guide tables is structured, i.e. in particular has regular protuberances or depressions. Thus, the rolls entrain treatment liquid and feed it against the board surface or simultaneously the liquid film is exchanged on the particular board surface. A further improvement to the treatment result in the marginal area in particularly critical cases is obtained in that the rolls of the guide tables are positioned with varying spacings, considered from the centre of the conveying plane, so that for the individual marginal area of the board and with equal spacing of the successively following rolls within the guide tables a reduced covering effect is obtained.

In less critical cases, due to the simpler manufacturing possibility, the recesses and openings in the guide tables will be located in substantially the sane lateral position, if this is possible from the standpoint of the board material to be treated or the treatment step to be carried out.

The inventive apparatus is admittedly mainly intended for the treatment of particularly thin printed circuit boards, but from the maximum thickness standpoint no limit is set, particularly if the guide elements positioned above the conveying plane can be raised as a function of the thickness of the boards to be treated.

This can e.g. be simply achieved in that a sensor, e.g. a mechanical sensor, is used for the thickness of the new board entering the apparatus and which leads to a raising of the upper guide elements. However, it is also possible to use any other mode for the detection of the board thickness of the boards entering the apparatus so as to permit the adjustment of the spacing of the guide tables located above and below the conveying plane in the sense of the invention.

The inventive apparatus can firstly be constructed with a fixed lateral spacing of the guide elements located on either side of the conveying path. Such an apparatus is intended for a standard board size or width and only allows relatively minor variations in this sense, because otherwise the guidance function of the guide elements could at least be lost on one side.

However, the inventive apparatus can also be constructed with a variable, lateral spacing of the guide elements on either side of the conveying path and at least one guide table is adjustable in its lateral spacing with respect to the centre of the conveying path. This creates the possibility of adapting the apparatus to different circuit board widths, whilst involving relatively low constructional costs.

The rolling table optionally provided between the guide elements located on either side of the conveying path is preferably positioned slightly lower than the guide elements, so that the plane defined by the rolling table and in which the circuit boards can be supported is somewhat lower than the guide plane defined by the guidance elements or the conveying plane for the boards.

In the case where printed circuit boards with a relatively large stiffness are to be treated, such an apparatus is equivalent to one in which the rolling table is removed, because the rolls thereof maintain a spacing with respect to the board surface, so that there is no marked influencing of the flow against the bottom of the board to be treated. However, the same apparatus can also treat relatively thin circuit boards, because in the case of a slight sagging in the centre of the conveying path, they are supported, to the extent necessary, by the rolling table. The term "slightly lower" is understood to mean a distance of about 1/10 mm and e.g. when using endless belts for the guide elements positioned below the conveying plane a belt thickness of approximately 0.5 mm is adequate for the distance to the plane defined by the central rolling table.

The endless belts can in principle be made from random materials, provided that they are compatible with the treatment medium and have an adequate dimensional stability for the operation of the apparatus. A particularly suitable material is glass fiber-reinforced Teflon belting. The belts are initially loosely fitted are are given their tension by a tensioning device acting on the side remote from the conveying plane. The tensioning device can e.g. be spring loaded or the tension can be produced by means of a lever action with a variable weight.

Preferably the belts are supported on the side thereof adjacent to the conveying plane by rolls. The width of the endless belts is preferably smaller or the sane as the width of the circumferential surface of the rolls. Thus, in those cases in which the marginal area of the circuit board is covered by the belt, so that substantially there is no treatment of the marginal area by the treatment liquid, the belts are virtually rolled onto the surface of the board and remain stuck there by a capillary action.

As a result of the regular return of the rolls the contact of the endless belts with the board surface is ensured, so that an unintentional raising of the belt during the passage through the apparatus is prevented.

Besides the aforementioned possibilities of applying the treatment liquid to the surfaces of the circuit boards, a preferred embodiment involves having a stationary wave, which delivers the liquid treatment medium in continuous manner to one board surface. The term stationary wave is understood to mean a nozzle arrangement, which constantly supplies to the board surface a continuous liquid flow, which at the most contains non-effective gas fractions, so that liquid is supplied in continuous form by the nozzle arrangement to the board surface.

A particularly preferred form of the stationary wave is provided in a continuously overflowing and continuously refilled bath through which the circuit boards are conveyed below or directly on the liquid surface. Considered in the conveying direction, the bath is bounded by self-closing seals on entry and exit and said seals close the passage gap for the boards, when said board has completely entered or has completely left the bath.

In such cases there is a completely defined treatment distance for the printed circuit board and the intensity of the treatment is substantially only dependent on the conveying speed of the boards through the apparatus, because only through the longitudinal extension of the apparatus in the conveying direction and the conveying speed is it possible to precisely adjust the treatment time.

Preferably, in this embodiment a construction is chosen in which the guide elements simultaneously define on either side of the conveying path an upper, lateral boundary creating between it and the traversing board one or more exits, particularly gaps for the treatment medium. Thus, the proportion of the treatment liquid in the vicinity of the guide elements is constantly exchanged with the refilling of the bath, so that in this area there is always fresh or reprocessed treatment medium available for the treatment process.

In the entrance area of the conveying means it is advantageous to have wedge-shaped guide surfaces on either side of the conveying path. The leading edge of new circuit boards entering the apparatus is therefore automatically centred on the conveying plane thereof, without it being necessary to take special precautions on the preceding apparatus to ensure an exact feeding of the boards into the following apparatus.

The transition from one apparatus to the next is facilitated in the case of typically modular overall installations in that the wedge-shaped guide surfaces of the guide tables at least partly project out of the apparatus casing and consequently can extend into a preceding module during coupling. The resulting overlap of the two conveying means of the preceding and following modules ensure an easy transition from one conveying means to the next.

BRIEF FIGURE DESCRIPTION

These and further advantages of the invention are described in greater detail hereinafter relative to the drawings, wherein show:

FIG. 1 A longitudinal section through an inventive apparatus.

FIG. 2 A sectional view through another embodiment of the invention.

FIG. 3 A sectional view through the apparatus of FIG. 1 along line 3—3.

FIG. 3a A sectional view of the apparatus of FIG. 1 along line 3—3, showing further a liquid bath of a treatment medium.

FIG. 4 A detailed view of a guide element of the embodiment of FIG. 2.

FIG. 5 A partly broken away side view of an alternative embodiment.

FIG. 6 A plan view of a detail of the embodiment of FIG. 5.

FIG. 7 A sectional view through a modular transition of the apparatus.

DETAILED DESCRIPTION OF PREFERRED EXAMPLE EMBODIMENTS

Figure 3A:
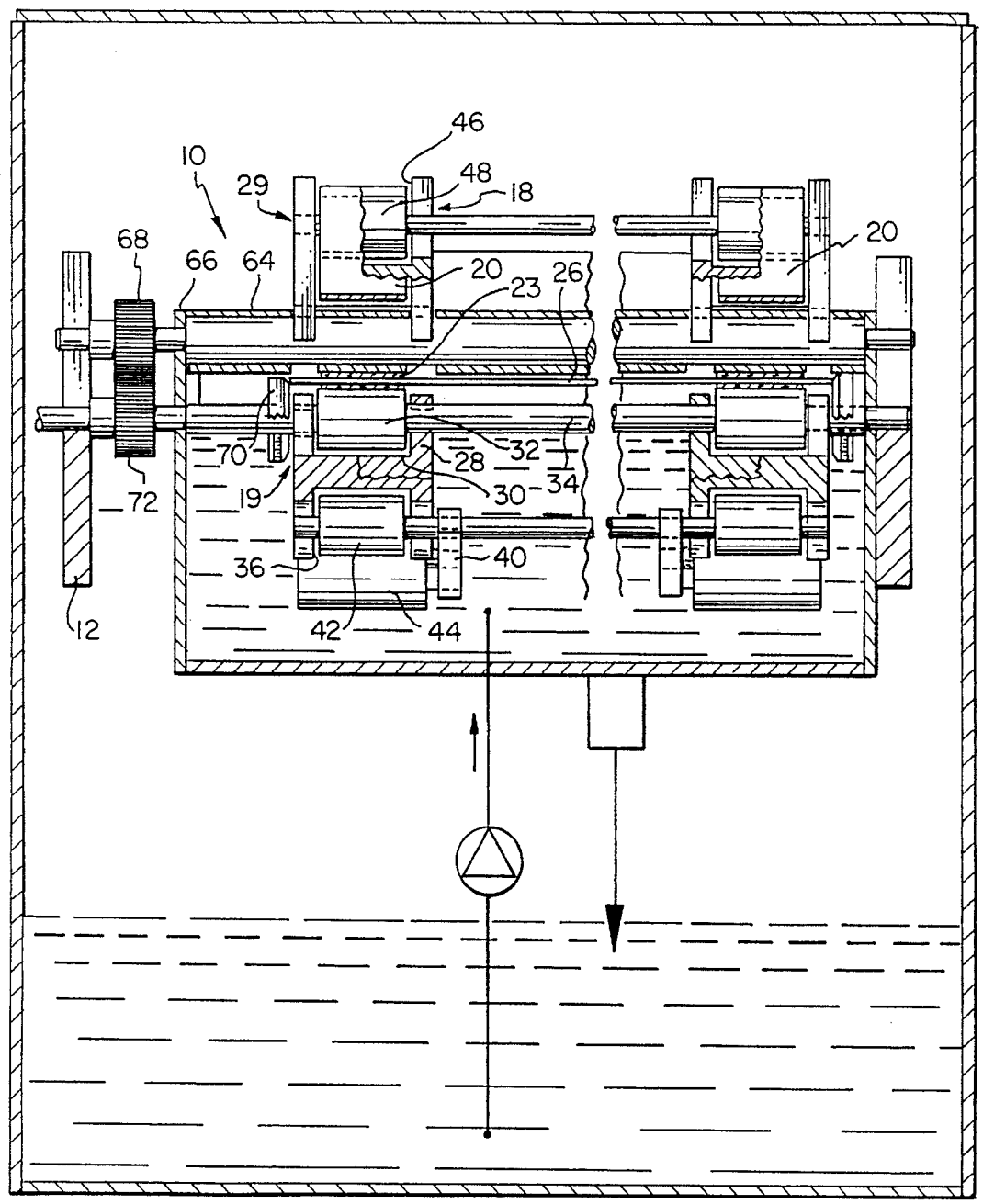

The apparatus shown in FIG. 1 carries the overall reference numeral 10. For reasons of simplicity FIG. 1 only contains the components most important for the purposes of the invention. The overall apparatus 10 is bounded by a casing wall 12 having on the intake side an inlet 14 and on the exit side an outlet 16. The inlets and outlet 14, 16 are sealed by not shown sealing elements, e.g. sealing lips or flaps, which ensure that no treatment liquid passes in undesired manner out of the casing 12.

The conveying means of the overall apparatus 10 has on either side of the conveying path and both above and below the conveying plane guide elements 18, 19, which comprise endless belts 20, 21. The endless belts 20, 21 are dimensioned in such a way that they extend with their side or strand 23, 24 facing the conveying plane along the entire conveying path through the apparatus 10.

The belts 20, 21 are driven (the drive will be described in greater detail in conjunction with FIGS. 3 and 4) and simultaneously serve to convey the printed circuit boards 26 through the apparatus. The guide element 19 positioned below the conveying plane for the boards 26, comprises an elongated, narrow body 28, which on its side facing the conveying plane has a channel-like, cross-sectionally rectangular recess 30, which is completely open towards the conveying plane (cf. FIG. 3). At regular intervals within said channel 30 there are rolls 32, which support the endless belt 21 defining the conveying plane on its upper side or strand 24.

In the side walls of the channel 30 there are bores or recesses, in which are held the shafts 34 carrying the rolls 32. The shafts 34 can extend over the entire width of the conveying path and are supported again in the body of the lower guide element facing the conveying path. This simultaneously permits the fitting of further rolls in the area of the conveying path between the lateral guide elements and a not shown rolling table. The diameter of the rolls of the rolling table can be identical to those located in the guide channel 30, because the thickness of the belt in itself ensures an adequate spacing of the circumferential surfaces of the rolls of the rolling table with respect to the conveying plane, which makes sure that with adequately stiff boards there is no contact with the board surface. In the case of mechanically less stable circuit boards, i.e. those which sag as a result of their own weight, the rolls prevent an excessive divergence from the conveying plane.

It is stressed that the endless belt 21 has no guidance on the side of its strand 24 adjacent to the conveying plane. The guidance of the endless belt 21 is ensured by a channel-like depression in the body 28, which is located on the body side remote from the conveying plane. The channel-like depression or guide channel 36 for the strand of the endless belt 21 remote from the conveying plane widens in the central part of the body 28 (considered in the conveying direction), so that the belt 21 is exposed over an area representing e.g. ⅓ to ¼ of the strand remote from the conveying plane, i.e. it is guided in such a way as not to be supported by the body 28.

In this area is provided a tensioning device 38, which e.g. comprises a spring-loaded pressing roll, as shown in FIG. 1, an eccentrically pivotably held rocking lever 40, which holds on a shorter arm an idle roll 42, whereas to the longer arm is fitted a weight 44, which ensures the necessary contact pressure for the idle roll 42 and the tension of the belt 21.

The guidance of the belt 21 in the channel-like depression 36 on the side of the body remote from the conveying plane is sufficient to give an adequate directional stability to the top side of the belt.

Above the conveying plane is provided a body 29 corresponding to the body 28 and which guides the belt 20 in the vicinity of the upper strand by a channel-like depression 46, in which the upper strand of the belt 20 passes over a larger area without the support of the channel-like guide and is tensioned by the weight of an idle roller 48 resting on the belt. It would be possible to provide at this point a spring-loaded or some other type of tensioning device. However, this is the most advantageous made for the fitting and maintenance of the apparatus.

The further embodiment of the overall apparatus 50 in FIG. 2 differs from that of FIG. 1 only in that the guide elements above the conveying plane comprise an endless belt, whereas the guide elements below the conveying plane have guide tables.

Whereas the guidance of the top of the printed circuit boards takes place by the belt, as in the apparatus of FIG. 1, the bottom of the board edges is guided by a substantially planar, elongated table, which has a plurality of openings arranged in regularly spaced manner and which form a connection to the recesses in which the rolls 58 are located, whose circumference only projects slightly over the table plane 60. The rolls 58 are rotatably held on shafts 62, which maintain a guidance in the table body 52. A detailed description of this embodiment is provided in connection with the embodiment shown in FIG. 5.

FIGS. 3 and 3a show the construction and operation of the embodiment according to FIG. 1 and the guide elements 18, 19, which are positioned above and below the conveying plane. The guide element 18 corresponds to the guide element 18a above the conveying plane in FIG. 2, so that the explanations already given once again apply.

The upper guide element 18 is shown with the intake-side guide roller 64 over which the belt 20 is guided on the entrance side. The roller 64 is held in non-rotary manner by a shaft 66, which carries at its end adjacent to the casing wall 12 a pinion 68 by means of which it is possible to drive the guide roller 64 and therefore also the endless belt 20.

The guide element 18 also comprises the body 29, which is shown in section in the vicinity of the entrance area of the overall apparatus 10. The upper strand of the belt 20 is guided on both sides and in slightly rising manner towards the outlet-side end of the apparatus by the body 29 and in this part runs in a channel-like depression 46 with a substantially rectangular cross-section.

As a result of the partly broken away representation it is possible to see the idle roller 48, whose weight ensures the tensioning of the belt 20. The shaft of the idle roller 48 is held in a slotted guide, which allows the idle roller to give way upwards.

Following a guidance of the belt 20 over the guide roller 64 the belt 20 with its lower strand 23 issues into the conveying plane and comes to rest on a marginal area of the circuit board 26.

As a gap is defined between the two endless belts 20, 21 which substantially corresponds to the thickness of the circuit board 26, the belt rests directly on the board surface and by the pressing cut of any liquid present a certain adhesion is obtained. This adhesion of the surface of the board 26 on the belts 20, 21 is adequate for a reliable, undelayed conveying of the circuit board through the apparatus.

The guide element 19 positioned facing the guide element 18 is shown in sectional view in FIG. 3 in the vicinity of the central part of the apparatus. The upper strand 24 of the belt 21 is supported by the roll 32 and engaged against the lower surface of the board 26.

Like the remaining rolls 32, the roll 34 shown is held in a channel-like depression 30, which extends substantially over the entire length of the guide element 19. The roll 32 is mounted in rotary manner by means of the shaft 34, which is supported in the walls of the channel-like depression 30. The shaft 34 can be constructed in such a way that it extends over the outside of the guide element 19 and then on said outwardly projecting part of the shaft 34 are mounted so-called spacing disks 70, which ensures that the circuit board does not undesirably diverge from the conveying direction during conveying.

The sectional representation of FIG. 3 also shows the tensioning device for the belt 21 which, as stated, comprises a simple rocking lever mechanism with the idle roll 42 and the weight 44, which are located on an eccentrically mounted lever 44.

In the entrance area the shaft 34 of the entry roller 64 is so extended that it can carry a pinion 72 meshing with the pinion 68. The shaft 34 introduces the driving force for the belts and by means of the pinion 72 and its meshing pinion 68 is transferred to the upper guide roller and therefore to the belt 20.

FIG. 4 shows a detail of a guide table, as used in the embodiment according to FIG. 2 for the lower guide element.

The guide table has a surface 60 which is substantially planar and is used for guiding the leading edges of the circuit boards 26 during their passage through the apparatus. The guide table 52 has recesses 74 passing from the top to the bottom and which in the vicinity of the surface 60 define a substantially rectangular opening 76. The rolls 58 are held in the recesses 74 in such a way that their circumferential surface only projects slightly over the table surface 60, but substantially completely fill the rectangular opening 76, so that between the circumferential surface of the roll 58 passing through the opening 76 and the edges of the latter only a relatively narrow gap is left. Common to all embodiments in which a roll is intended to contact a circuit board surface, rolls 58 may be structured with protuberances or depressions 77 to entrain treatment liquid and feed it against the board surface.

On the shafts projecting outwards over the guide element are once again provided spacing disks 70, which ensure that the circuit boards do not pass out of the area of the treatment zone or the conveying path.

The embodiment of the guide elements shown in FIG. 4 is suitable for numerous applications, but it is not necessary to require excessive precision in the processing or working quality for the marginal areas.

Figure 5:
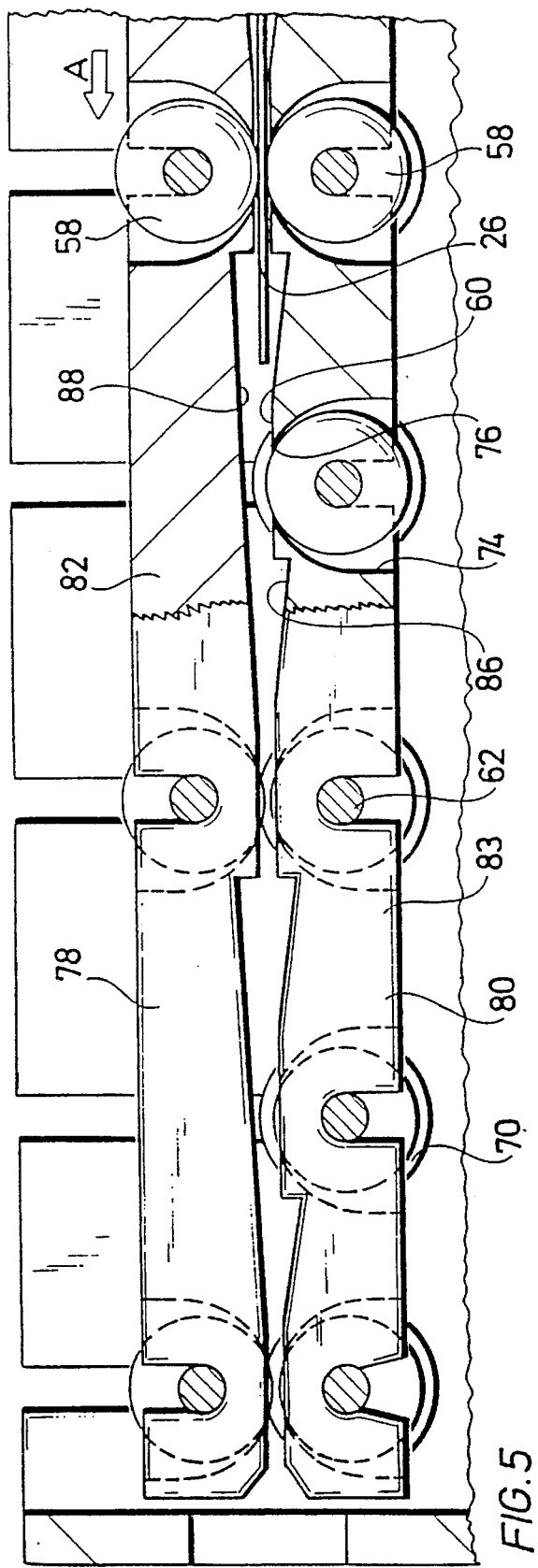

If the marginal areas are to undergo a substantially identical treatment by the treatment liquid, as takes place in the case of the central parts of the circuit board, preference is given to the use of an embodiment of the guide tables as shown in FIG. 5. The guide tables 78, 80 in FIG. 5 result from an embodiment in which the guide elements are constituted by such tables both above and below the conveying plane.

To ensure a better access of the treatment liquid to the marginal area of the surfaces of the circuit boards 26, the bodies 82, 83 in the areas between two following rolls 58 are provided with an offset, which, considered in the conveying direction of arrow A, is initially set beck in step-like manner and substantially at right angles from the table surface 60, whilst the following guide surface 86 approaches with a limited gradient the normal level of the table plane 60.

As a result of this construction of the bodies 82, 83, the surfaces of the board 26 shortly following contact with a roll 58 are exposed to the free treatment medium, whereas the surface following on to the offset possibly of the leading edges of the boards diverging from the conveying plane are slowly returned to the level of the table plane 60, where they are then taken up and passed on by the following roll 58.

As generally the treatment of the top of the board 26 is more critical, the spacing of the rolls and therefore the dimensioning of the offsets 88 is made larger in the case of the guide elements positioned above the conveying plane, so that over a larger period of time free access of the treatment medium to the board surface is ensured.

FIG. 5 also shows a particularly simple construction of the guide elements, in which the bodies 82 are mounted solely by means of the rolls fixed to the shafts and which are supported in rotary manner by the overall apparatus, the recesses in the body provided for the passage of the shafts ensure an adequate guidance for the latter. The upper guide elements are fitted in such a way that initially the body 82 is inserted in the apparatus and then the rolls 58 already fitted to their shafts. This simple fitting requiring no separate fastening is very maintenance friendly, because the components, e.g. in the case of wear or extreme dirtying, can be removed or reinserted with respect to the apparatus substantially without any use of tools. This allows an excellent reaction time in the case of faults and leads to a very high availability of the installation.

Figure 6:
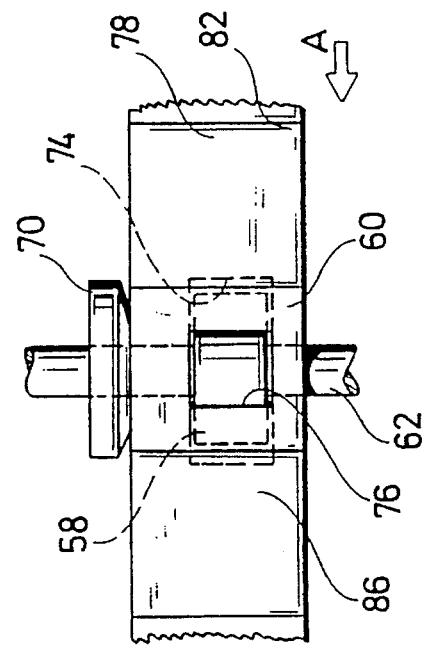

Finally FIG. 6 shows in plan view a guide table 83, the offsets 86 being more clearly visible over the essential part of the intermediate area between two successive rolls 58. The offsets 86, 88 located in the table surface 60 simultaneously serve to laterally remove the treatment liquid, which leads to a particularly intense exchange and the provision of constantly replenished treatment liquid in the marginal area of the circuit boards to be treated.

Normally circuit boards in an overall installation undergo different treatment processes in different stages and therefore the overall installation is constructed in modular manner from individual apparatuses. Preferably within the individual modules use is made of identical or similar conveying systems and to the maximum possible extent the modules have an identical construction.

Figure 7:
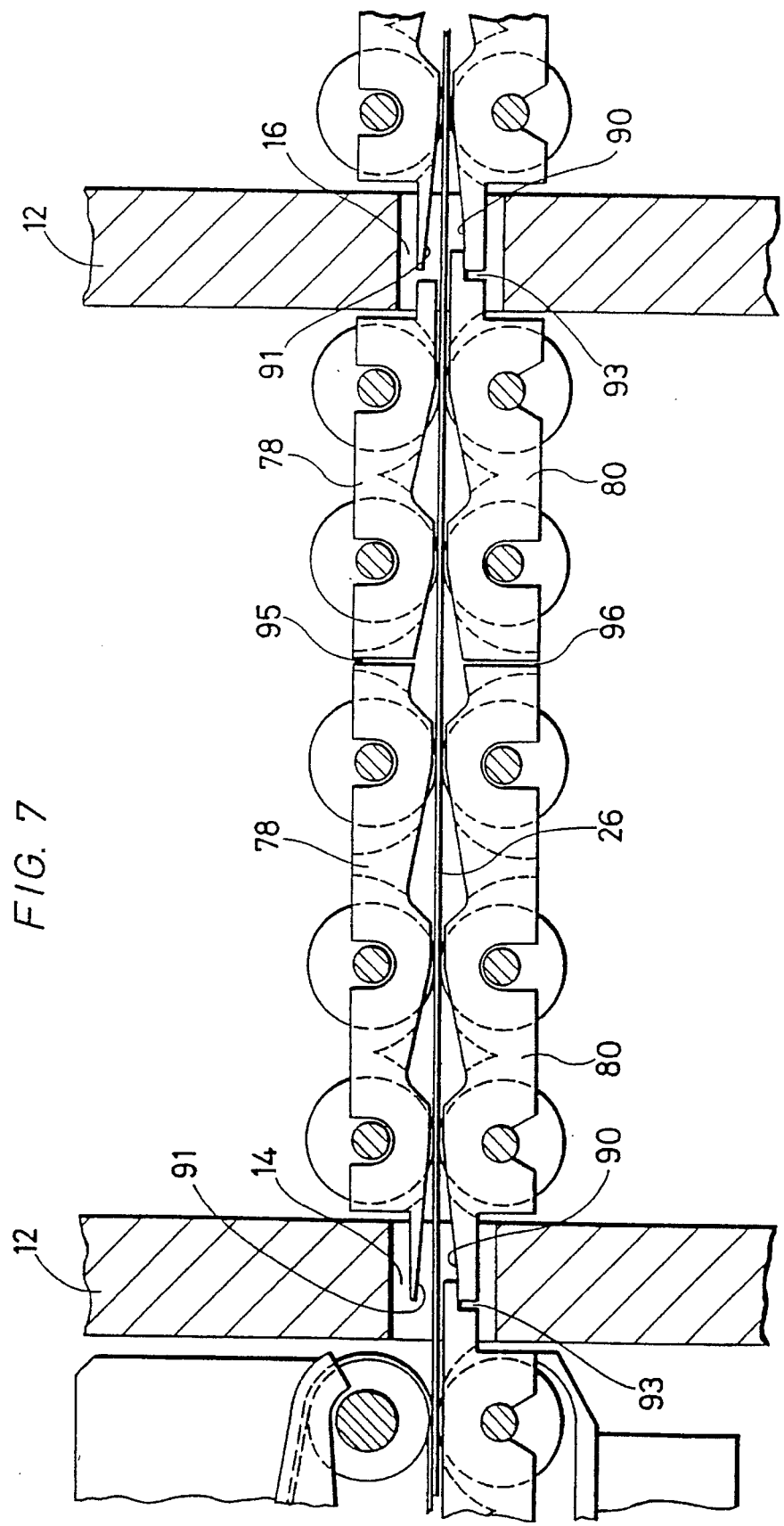

To facilitate the transition between individual modules or apparatuses, as shown in FIG. 7 the guide tables have at their entrance-side end wedge-shaped guide surfaces above and below the conveying plane and on either side of the conveying path, so that there is an automatic centring on the conveying plane for the leading edge of the entering circuit board 26.

The exit-side end of an apparatus or module is so adapted that at least for the table means below the conveying plane by means of a shoulder 93 an overlap is possible with the wedge-shaped surface 90 of the following module.

This makes it possible to build up a randomly extendable conveying path for the circuit boards through the overall installation, without at the transition points between the modules or between the apparatuses there being any zonal decelerating effects and delays to the boards and therefore tilting within the apparatus.

The conveying means with the guide tables 78, 80 within an apparatus can be built up in modular manner and then between the guide table modules joints 95, 96 are obtained in the manner shown in FIG. 7. The treatment of printed circuit boards in horizontal installations requires a constant conveying speed for the boards through the overall installation, so that chemical or physical processes which require a longer or shorter period of time, measured against the otherwise standard treatment time, make it necessary to lengthen or shorten the individual apparatus or module. Using the split guide tables within a module it is easy to take account of this requirement, without it being necessary to keep large stocks of components for the conveying paths.

I claim:

1. Apparatus for treating a flat bendable printed circuit board with a treatment medium, said circuit board having oppositely facing major surfaces and edges on marginal zones thereof, said apparatus comprising:

conveying means defining a conveying path, a conveying direction, a conveying width extension and a conveying plane for said circuit board, said conveying path defining spaced lateral path sides and said conveying plane defining remote first and second plane sides;

rotary means on at least one of said remote plane sides, said rotary means including at least one shaft engaging a body portion; and supporting means for supporting said shaft in a supported operating state in said apparatus;

wherein at only said first plane side said conveying means include laterally spaced conveying belts having remote first and second strand sections, said first strand sections are located closer to said conveying plane than said second strand section for directly engaging the circuit board, and tensioning means are provided for tensioning said conveying belts; and roller tracks including following and laterally spaced support rollers on said second plane side for circumferentially directly engaging only the marginal zones, said support rollers projecting through openings in laterally spaced guide tables, providing guide faces limiting bending of the circuit board between said following support rollers by sliding engagement, said tensioning means including a tensioning member defining a weight for tensioning said conveying belt.

2. Apparatus for treating a flat bendable printed circuit board with a treatment medium, said circuit board having oppositely facing major surfaces and edges on marginal zones thereof, said apparatus comprising:

conveying means defining a conveying path, a conveying direction, a conveying width extension and a conveying plane for said circuit board, said conveying path defining spaced lateral path sides and said conveying plane defining remote first and second plane sides;

rotary means on at least one of said remote plane sides, said rotary means including at least one conveying belt directly engaging the circuit board and at least one shaft engaging a body member; and supporting means for supporting said shaft in a supported operating state in said apparatus;

wherein said conveying means include at least one roller track with support rollers having circumferences for engaging the circuit board on said first plane side, said circumferences providing means for feeding the treatment medium to the circuit board and for exchanging the treatment medium at the circuit board, said feeding means including regular protuberances and depressions along said circumference, said feeding means further including a liquid bath filled with the treatment medium up to a liquid surface provided at said conveying path.

3. Apparatus for treating a flat bendable printed circuit board with a treatment medium, the workpiece having oppositely facing first and second major surfaces and edges on marginal zones thereof, said apparatus comprising:

conveying means defining a conveying path, a conveying direction, a conveying width extension and a conveying plane for the circuit board, said conveying path defining spaced lateral path sides and said conveying plane defining remote first and second plane sides, said conveying path being provided in the vicinity of a liquid medium surface of a liquid bath filled with said treatment medium;

said conveying means including upper and lower conveying units, said conveying units including guiding units laterally spaced and facing one another on at least one of said first and second plane sides, each of said guiding units providing an elongated body member with rotary means for supporting the circuit board along said conveying path, said rotary means including support rollers, shafts mounting said support rollers, and at least one conveying belt for directly engaging one of the major faces of the circuit board at one of the marginal zones, each body member providing a guide face for guiding the circuit board and having regularly spaced recesses providing openings in said guide face, said recesses receiving said support rollers circumferentially projecting only slightly beyond said guide face in the direction of said conveying plane; and supporting means for supporting said shafts and body members in a supported operating state in said apparatus;

wherein at least one said body member provides a conveyor support for slidingly supporting the circuit board along said conveying path and between said support rollers.

4. Apparatus in accordance with claim 3 wherein said body member is removably mounted on said shaft when said shaft is in said operating state.

5. Apparatus in accordance with claim 4 wherein said body member and shaft are adapted to enable said removable mounting without the use of a mounting tool.

6. Apparatus in accordance with claim 3, wherein said rotary means are positively driven.

7. Apparatus in accordance with claim 3, wherein said shafts project laterally beyond said body member.

8. Apparatus in accordance with claim 3, wherein said shafts are guided in a body depression of said body member.

9. Apparatus in accordance with claim 3, wherein said shafts provide said support rollers for supporting said circuit board and said conveying belt.

10. Apparatus in accordance with claim 3, wherein one of said shafts and said body member comprise means for preventing the circuit board from laterally deviating from said conveying direction.

11. Apparatus in accordance with claim 10, wherein said shafts comprise said preventing means.

12. Apparatus in accordance with claim 10, wherein:
said body member has an outside;
said shafts extend beyond said outside with shaft sections, and
said preventing means provide spacing disks mounted on said shaft sections.

13. Apparatus in accordance with claim 12, wherein:
said body member has a top side and a bottom side;
said recesses pass from said top side to said bottom side; and
said support rollers are held inside said recesses, said support rollers extending beyond said top side in the direction of said conveying plane, said top side providing said guide face.

14. Apparatus in accordance with claim 13, wherein:
said recesses provide said openings in the vicinity of said top side; and
said support rollers substantially fill said openings and serve to feed said treatment medium, the circuit board being free of support in a center zone between the marginal zones.

15. Apparatus in accordance with claim 14, wherein:
said support rollers are laterally guided by said openings and are provided on a common one of said shafts.

16. Apparatus in accordance with claim 15, wherein said shafts extend substantially over the entire conveying width extension.

17. Apparatus in accordance with claim 3, wherein:
two opposing body members are provided on one of said remote plane sides, each adjacent a respective one of said lateral path sides; and
said shafts engagingly support both of said body members.

18. Apparatus in accordance with claim 3, wherein:
each of said shafts bears a plurality of said support rollers for supporting said circuit board;
said conveying plane and said conveying path define a center; and
at least two of said support rollers have varying spacings from said center.

19. Apparatus in accordance with claim 3, wherein:
said conveying belt is permeable to said treatment medium, 20. Apparatus in accordance with claim 3, wherein:
said conveying belt has a strand section remote from said conveying path;
guide means are provided for laterally guiding said conveying belt; and
said conveying belt is exclusively laterally guided by said strand section engaging said guide means.

21. Apparatus in accordance with claim 3, wherein:
said conveying belt has remote first and second strand sections;
said first strand section is located closer to said conveying plane than said second strand section; and
tensioning means are provided for tensioning said conveying belt;
said tensioning means including a tensioning member defining a weight for tensioning said conveying belt.

22. Apparatus in accordance with claim 21, wherein:
a mounting shaft is provided for holding said tensioning member; and
a slot guide is provided for guiding said mounting shaft.

23. Apparatus in accordance with claim 3, wherein:
said support rollers have a circumference for engaging the circuit board, said circumference providing means for feeding the treatment medium from said liquid bath to the circuit board and for exchanging the treatment medium at the circuit board, said feeding means including regular protuberances and depressions along said circumference; said support rollers engaging only the marginal zones.

24. Apparatus in accordance with claim 3, wherein:
said conveying belt is made from fiber-reinforced plastic material.

25. Apparatus in accordance with claim 3, wherein:
said conveying belt is made from glass fiber-reinforced tetrafluorethylene.

26. Apparatus in accordance with claim 3, wherein:
means are provided for preventing treatment of partial sections of said circuit board with said treatment medium by rolling said conveying belt against said partial sections, whereby said conveying belt temporarily adheres to said partial sections by capillary action.

27. Apparatus in accordance with claim 3, wherein said treatment medium contains at least one of a cleaning liquid, an etching liquid, a metallizing liquid and a rinsing liquid.

28. Apparatus in accordance with claim 3, wherein:
said conveying belt defines a width extension parallel to said conveying width extension;
said conveying belt being positioned to cover and engage only the marginal zones of said circuit board.

29. Apparatus in accordance with claim 3, wherein:
said openings have boundaries spaced from said support rollers by small gaps provided between said support rollers and said guide face; and
said support rollers comprise means for feeding said treatment medium from said liquid bath through said gaps.

30. Apparatus in accordance with claim 3, wherein:
two body members are provided with a lateral spacing therebetween; and
means are provided for adjusting the extent of said lateral spacing.

31. Apparatus in accordance with claim 3, wherein:
said conveying belt defines a belt width extension;
said support rollers have a circumferential supporting face defining a roller width extension; and
said belt width extension is no greater than said roller width extension, said conveying belt being provided for engaging only one of said marginal zones.

32. Apparatus in accordance with claim 3, wherein at least one body member provides a channel, said support rollers extending within said channel and supporting said conveying belt, said channel defining side walls supporting said shafts.

33. Apparatus in accordance with claim 3, wherein:

on said first plane side said body member provides a guide table including said guide face for the circuit board;

on said second plane side said body member provides a belt guide for said conveying belt;

said guide table provides said recesses; and said conveying belt has a belt strand directly engaging the circuit board and supported by a roller track provided by said support rollers.

34. Apparatus in accordance with claim 33, wherein said conveying belt is located above said conveying plane, and said guide face and the support rollers which support said roller track are positioned below said conveying plane.

35. Apparatus in accordance with claim 34, wherein said belt guide comprises a depression in said body member.

36. Apparatus in accordance with claim 34, wherein said body member comprises tensioning means for said conveying belt disposed in said belt guide.

37. Apparatus in accordance with claim 3, wherein:

said shafts provide said support rollers; and said body member includes depressions for receiving said shafts;

said guide face being provided for slidingly engaging and limiting bending of the circuit board.

38. Apparatus in accordance with claim 37, wherein said support rollers extend beyond said guide face by only about five tenths of a millimeter.

39. Apparatus in accordance with claim 3, wherein:

the upper conveying unit comprises two conveying belts for covering only the marginal zones of one of the major surfaces, said conveying belts being supported by roller tracks; and said lower conveying unit is exclusively provided by a roller track including said support rollers directly engaging the circuit board.

40. Apparatus in accordance with claim 33, wherein:

said body members define lateral member outsides, at said member outsides said shafts including means for preventing the circuit board from laterally deviating out of said conveying direction, said shafts providing shaft sections extending beyond said lateral member outsides, said preventing means including spacing members provided on said shaft sections.

41. Apparatus in accordance with claim 40, wherein said spacing members include spacing discs mounted on and fixed to said shaft sections.

\* \* \* \* \*